United States Patent [19]

Matsuoka et al.

[11] Patent Number: 5,026,303
[45] Date of Patent: Jun. 25, 1991

[54] SLOTLESS TYPE IC CARRIER

[75] Inventors: Noriyuki Matsuoka; Masaaki Kubo, both of Tokyo, Japan

[73] Assignee: Yamaichi Electric Manufacturing Co., Ltd., Tokyo, Japan

[21] Appl. No.: 525,308

[22] Filed: May 18, 1990

Related U.S. Application Data

[63] Continuation of Ser. No. 318,714, Mar. 3, 1989, abandoned.

[30] Foreign Application Priority Data

Mar. 10, 1988 [JP] Japan ................................. 63-57898
May 23, 1988 [JP] Japan ............................ 63-67831[U]

[51] Int. Cl.⁵ ............................................. B65D 73/02
[52] U.S. Cl. .................................... 439/526; 206/328; 206/331
[58] Field of Search ....................... 439/70, 71, 72, 73, 439/525, 526; 206/328, 329, 330, 331, 334; 324/158 F

[56] References Cited

U.S. PATENT DOCUMENTS

| | | | |
|---|---|---|---|
| 3,354,394 | 11/1967 | James | 324/158 F |
| 3,454,921 | 7/1969 | Coleman et al. | 439/526 |
| 3,529,277 | 5/1968 | Barnes | 439/526 |
| 3,568,129 | 3/1971 | Gold et al. | 324/158 F |
| 3,652,974 | 3/1972 | Tems | 439/526 |
| 4,435,724 | 3/1984 | Ralstin | 357/79 |
| 4,585,121 | 4/1986 | Capelle, Jr. | 206/334 |
| 4,747,483 | 5/1988 | Grabbe | 206/331 |
| 4,881,639 | 11/1989 | Matsuoka et al. | 206/328 |

FOREIGN PATENT DOCUMENTS

58-207659 12/1983 Japan ................................. 439/72

Primary Examiner—Neil Abrams
Attorney, Agent, or Firm—Wenderoth, Lind & Ponack

[57] ABSTRACT

An IC carrier includes an IC accommodating section formed in a central portion of a generally rectangular thin substrate, a lock for holding an IC package body in the IC accommodating section, and a lead wire supporting seat disposed on a substrate portion extending at the periphery of the IC accommodating section and adapted to support lead wire groups projecting sideward from the IC package body. The lead wire supporting seat is defined by a slotless flat surface for accommodating a group of the lead wires over its entire width. The lead wire groups are supported as a package on the lead wire supporting surfaces.

7 Claims, 7 Drawing Sheets

SLOTLESS TYPE IC CARRIER

This application is a continuation of now abandoned application Ser. No. 07/318,714 filed on March 3, 1989.

BACKGROUND OF THE INVENTION

1. Field of the Invention

This invention relates to a carrier for an IC package having lead wire groups projecting sideward from two sides or four sides thereof, and more particularly to a novel slotless type IC carrier for holding an IC package without accommodating individual lead wires in slots.

2. Brief Description of the Prior Art

IC carriers are used in order to protect an IC body portion as well as the leads thereof when an IC package is being conveyed and handled. A basic form of such conventional IC carriers comprises, as disclosed in U.S. Pat. Nos. 3,652,974 and 3,529,277, a rectangular thin substrate formed in its central portion with an IC accommodating section in which an IC package body is received. Lead wires projecting sideward from the IC package body are individually accommodated in slots extending parallel to one another in the outer surface of the carrier, and lock claws, etc. provided at the peripheral portion of the IC accommodating section are brought into engagement with the IC package body. In the foregoing accommodated state, the IC package is supported on the IC carrier.

The basic idea that IC lead wires be accommodated in the slots extending in the outer surface of a carrier body in parallel with one another has consistently been considered to be best since the introduction of IC carriers. IC carriers of the above-mentioned type are acceptable when the pitch between the IC lead wires is relatively large and the IC lead wires have sufficient rigidity. Therefore, conventional IC carriers of this type have been widely used.

However, in recent years, the pitch between the lead wires has become very minute in an IC package of the type having lead wires projecting sideward therefrom and the lead wires have also become very thin and thus are easily deformed. Necessarily, the pitch between the slots is required to be more and more minute and the partition walls dividing the slots are required to be thinner and thinner. Therefore, the mass production of the IC carrier requires advanced molding techniques. In addition, the operation of inserting and removing the IC package in and from the IC carrier, particularly the operation of accommodating the individual lead wires in the individual slots requires much time and labor, and the lead wires are often deformed during the inserting and removing operations. That is, when the IC package is to be inserted in the IC carrier, the IC package is inserted in such a manner as to align the individual IC lead wires and the individual slots with each other by eye. Incorrect eye measurement often results in the lead wires being disposed over the partition walls dividing the slots. If a pushing-in force is applied in such a state, the lead wires are readily deformed thereby making otherwise good products into inferior products.

Furthermore, the conventional IC carriers having slot groups of a predetermined size can be used only for IC packages having IC lead wires of the same pitch and the same width and they cannot be used for IC packages having IC lead wires of different pitches and different widths. Therefore, they lack interchangeability. This is inconvenient for users because they are compelled to prepare many kinds of carriers which can be used for the many kinds of IC packages available, and thus the conventional IC carrier is deemed to be very uneconomical.

The present invention has been accomplished in order to overcome the above-mentioned problems.

SUMMARY OF THE INVENTION

It is therefore an object of the present invention to provide a slotless type IC carrier in which an IC package can be inserted into an IC carrier very easily.

Another object of the invention is to provide a slotless type IC carrier in which lead wires are effectively prevented from being deformed during the insertion of an IC package into the carrier.

A further object of the invention is to provide an IC carrier which can accommodate IC packages with lead wires of different pitches and widths and which has a good interchangeability.

In order to achieve the above objects, there is essentially provided in an IC carrier including an IC accommodating section formed in a central portion of a generally rectangular thin substrate, and lock means for holding an IC package body in the IC accommodating section, a lead wire supporting seat disposed on a substrate portion extending around the periphery of the IC accommodating section and adapted to support lead wire groups projecting sideward from the IC package body, the lead wire supporting seat defined by a slotless flat surface for accommodating a group of lead wires over its entire width, the lead wire groups being supported as a package on the lead wire supporting surfaces.

According to the present invention, the lead wires projecting sideward from the side surfaces of the IC package are not individually accommodated in slots as in the prior art but are supported, as a package, on the lead wire supporting flat and slotless surfaces of a lead supporting seat. Therefore, the problems associated with the conventional slot type IC carrier of the lead wires being deformed by the partition walls of the slots due to incorrect eye measurement as to the positional alignment of the lead wires and the slots, resulting in otherwise good products being made into inferior products, are overcome. In addition, since the IC package can be inserted without paying much attention to aligning the individual lead wires with the individual slots provided in the prior art, the inserting operation of the IC package in the IC carrier can be performed very easily and rapidly.

Furthermore, since the lead wire supporting flat surface of the lead wire supporting seat may be designed simply to accommodate for the width of a respective lead wire group, the pitch of the individual lead wires and the widths of the lead wires are not restricted.

Therefore, as long as the IC carrier can accommodate the lead wire groups, it can support various IC packages having different individual lead wire pitches and different lead wire widths. That is, one kind of IC carrier can support many different IC packages of which only the pitch and the widths of the individual lead wires are different. On the contrary, the conventional IC carriers can receive only lead wires having the same pitch and the same width and lack an interchangeability capability and thus are very uneconomical.

A slotless type IC carrier of the present invention allows the recent requirements for very minute and very thin IC lead wires to be realized.

That is, the present invention obviates the problems in a slot forming technique required to be performed in association with very minute pitches of lead wires. In addition, the possible deformation of the lead wires and inefficient inserting operation of an IC package is overcome.

BRIEF DESCRIPTION OF THE DRAWINGS

The foregoing and other objects, features and advantages of the present invention will become apparent from the following detailed description of the preferred embodiments of the invention as illustrated in the accompanying drawings wherein:

FIGS. 6(A) and 6(B) are central sectional views of the IC carrier, wherein FIG. 6(A) illustrates a state prior to the insertion of the IC package and FIG. 6(B) illustrates a state after the insertion of the IC package;

DETAILED DESCRIPTION OF THE PREFERRED EMBODIMENTS

Preferred embodiments of the present invention will be described hereinafter with reference to FIG. 1 through FIG. 14.

Reference numeral 1 denotes a carrier body formed of synthetic resin. The carrier body 1 has a generally rectangular shape and is provided with an IC accommodating section 2 opened up in a generally central portion thereof. The IC accommodating section 2 has a generally rectangular shape. The IC accommodating section 2 accommodates therein a generally rectangular IC package 3 such that the corresponding sides thereof are brought to be parallel with each other.

Figure 1:
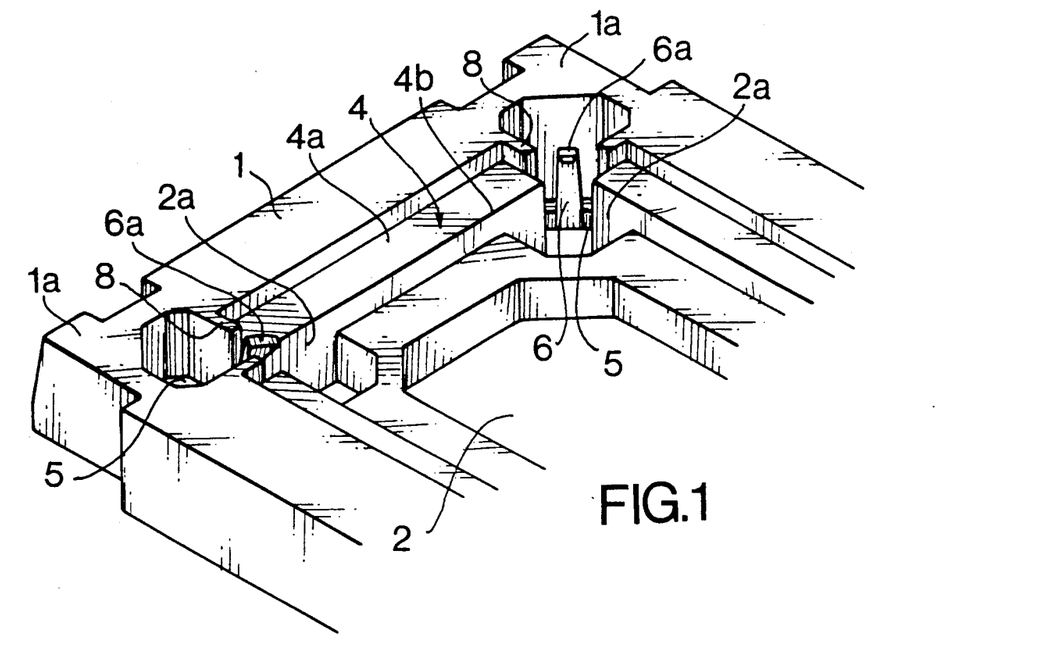
FIG. 1 is a perspective view of an important portion of a slotless type IC carrier according to one embodiment of the present invention.
Figure 2:
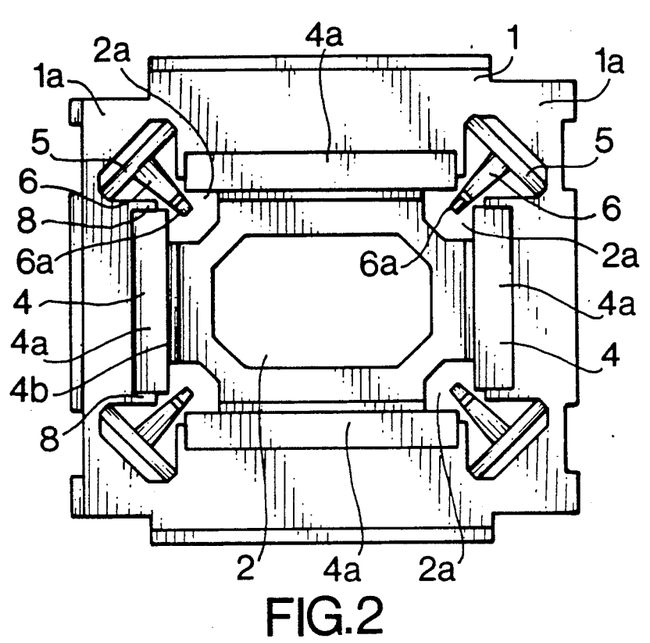
FIG. 2 is a plan view of the IC carrier.
Figure 3:
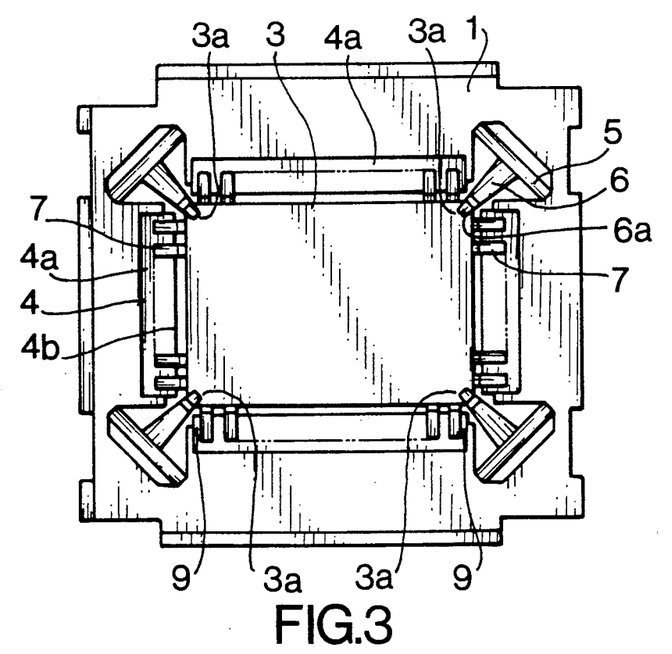
FIG. 3 is likewise a plan view of the IC carrier but with an IC package inserted therein.
Figure 4:
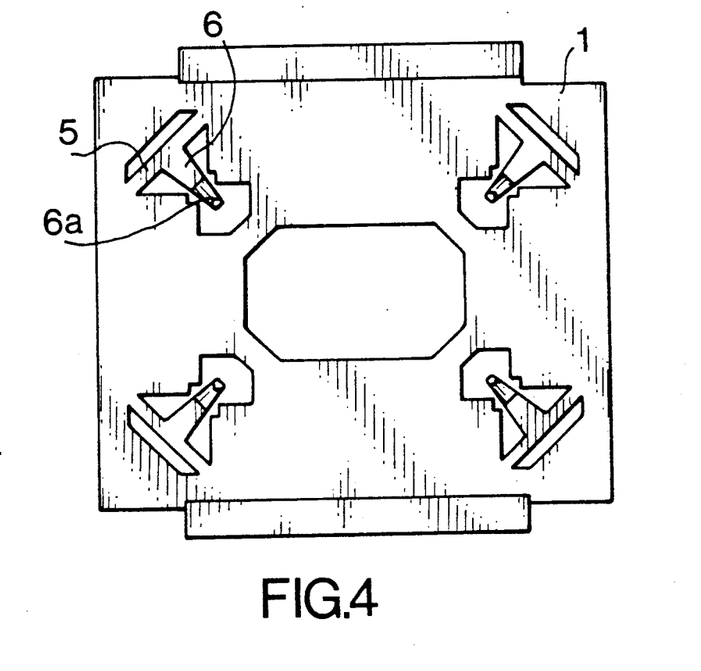
FIG. 4 is a bottom view of the IC carrier.
Figure 5:
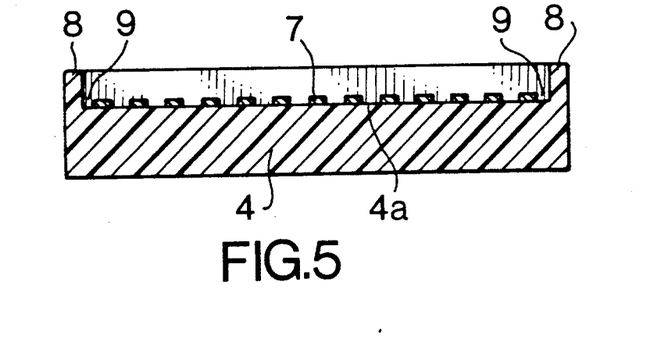
FIG. 5 is a sectional view taken through a lead wire seat of the IC carrier.

Two opposite sides or four opposite sides of the IC accommodating section 2, as shown in FIG. 1 through FIG. 6, are provided with lead wire supporting seats 4 for accommodating the groups of lead wires 7 projecting sideward from two sides or four sides of the IC package 3. Each of the lead wire supporting seats 4 is defined by a lead wire supporting flat surface 4a adapted to support the respective groups of the lead wires 7. More specifically, the lead wire supporting surface 4a is not provided with slots or slot partition walls for accommodating the individual lead wires 7 of each group. Instead, the lead wire supporting surfaces 4a are flat surfaces having generally the same widths as those of the groups of lead wires 7 projecting sideward from each side of the IC package 3 and support the groups of the lead wires 7 projecting sideward from each side of the IC package 3, respectively, as shown in FIG. 3, FIG. 5 and FIG. 6(B). At the same time, the respective lead wire supporting surfaces 4 define the IC accommodating section 2.

Figure 6A:
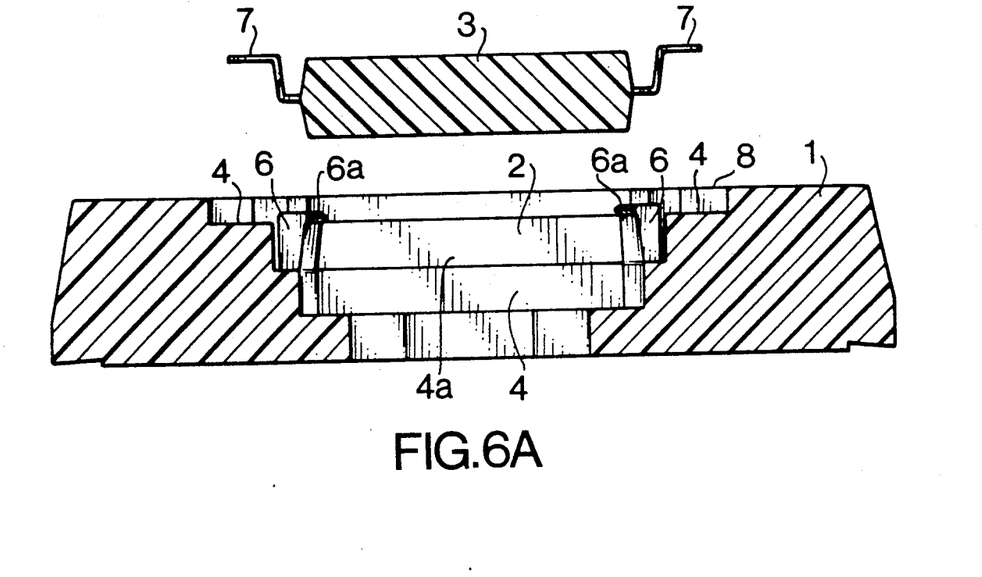
Figure 6B:
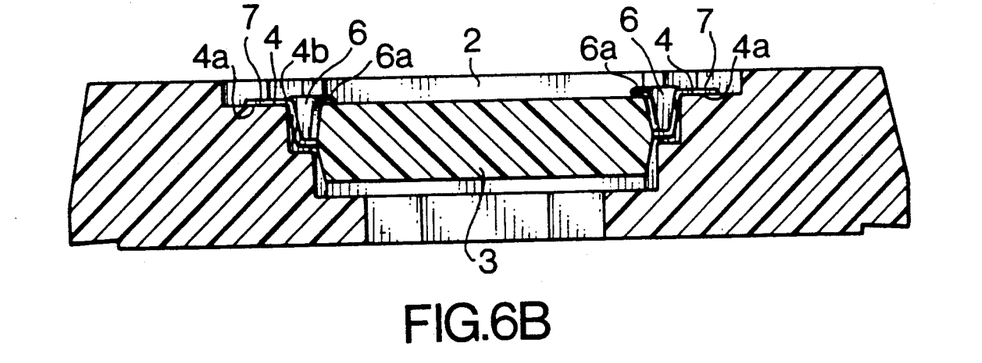
Figure 7:
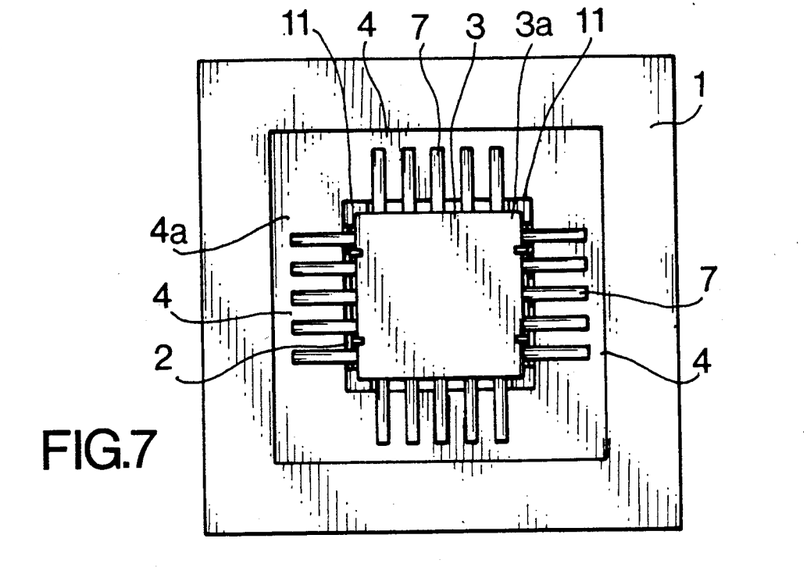
FIG. 7 is a plan view of an IC carrier with an IC package inserted therein according to another embodiment of the invention.
Figure 8:
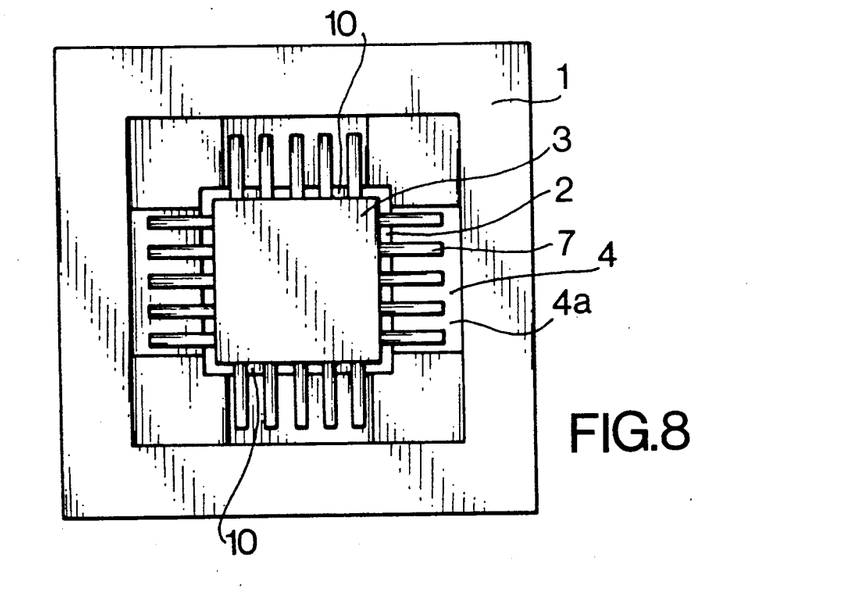
FIG. 8 is a plan view of an IC carrier having another means for correctly positioning an IC package.
Figure 9:
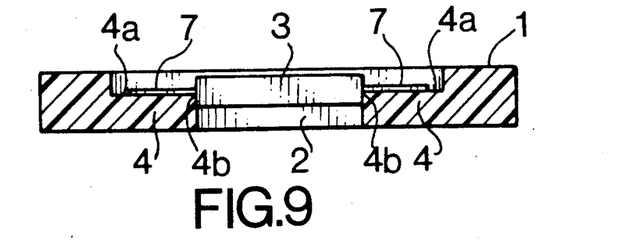
FIG. 9 is a sectional view of an IC carrier having still another means for correctly positioning an IC package.

As is shown in FIG. 6(A) and FIG. 6(B), when the lead wires 7 have a configuration bent into two stages, front edge angular portions 4b of lead wire supporting seats 4 complement the bent portions of the lead wires so as to correctly position the IC package 3. Also, as is shown in FIG. 7, corner portions 2a of the IC accommodating section 2 are each provided with a corner scale piece 11 for positioning corner portions 3a of the IC package 3. Also, as is shown in FIG. 9, when the lead wires 7 are linear, the front edge angular portions 4b complement the side surfaces of the body of the IC package 3 to correctly position the same. Also, as is shown in FIG. 8, the lead wire supporting seat 4 is provided on its inner surface with a projecting piece 10 to be interposed between the lead wires 7. The projecting piece 10 complements the side surfaces of the body of the IC package 3 to correctly position the same.

In the embodiment shown in FIG. 1 through FIG. 6 and FIG. 8, the lead wire supporting flat surface 4a of the lead wire supporting seat 4 is wide enough to receive each group of the lead wires 7 projecting sideward from each side of the IC package 3. And, the lead wire supporting surface 4a terminates, at each end, with a width establishing portion 8 for restraining the lead wires 7 at the ends of the groups of the lead wires 7. The width establishing portions 8 may be spaced such that a suitable amount of play is established so that the lead wire groups can be accommodated with ease.

Also, in the embodiment of shown in FIG. 7, the lead wire supporting surfaces 4a of the lead wire supporting seats 4 disposed in the four directions are contiguous to each other on a common plane, thereby forming a frame-like flat and slotless supporting surface around the periphery of the IC accommodating section 2.

Furthermore, FIG. 10 through FIG. 14 shows another embodiment in which the lead wire supporting surface 4a is partitioned by a limited number of partition walls 4c and the partition walls 4c are interposed between predetermined lead wires.

That is, in the embodiment of FIG. 10 through FIG. 14, four sides or two sides defining the IC accommodating section 2 are provided with a lead wire supporting seat 4 for accommodating and holding the lead wire groups 7 projecting from four sides or two sides of the IC package 3. The lead wire supporting surface 4a of the lead wire supporting seat 4 is partitioned by the partition wall 4c interposed between the lead wires in the vicinity of the central portion of the lead wire group 7. And, the group of the lead wires 7 divided by the partition wall 4c into a plurality of groups are supported on the respective lead wire supporting seats $4a_1$, $4a_2$.

Figure 10:
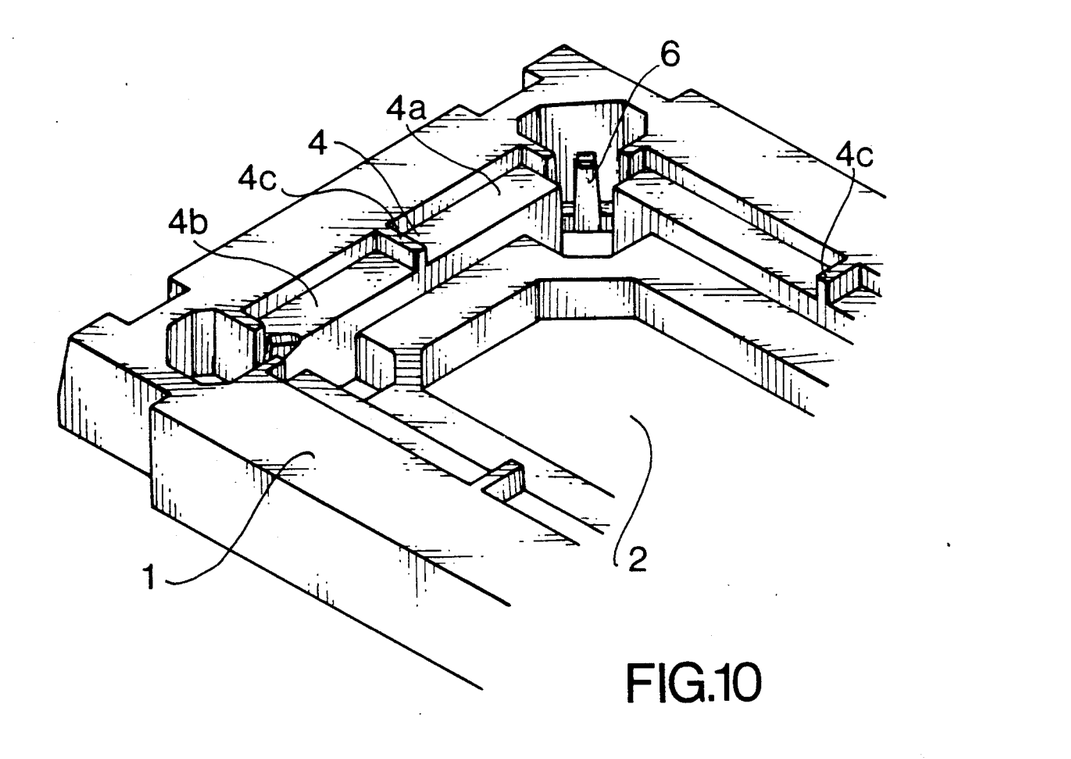
FIG. 10 is a perspective view of an important portion of an IC carrier according to another embodiment of the invention in which a lead wire supporting seat is partitioned by a single partition wall.
Figure 11:
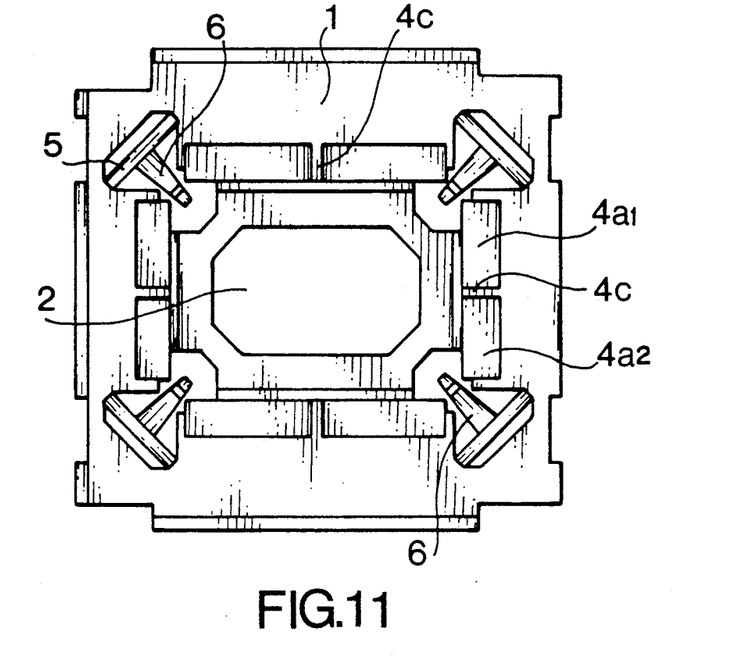
FIG. 11 is a plan view of the IC carrier of FIG. 10.
Figure 12:
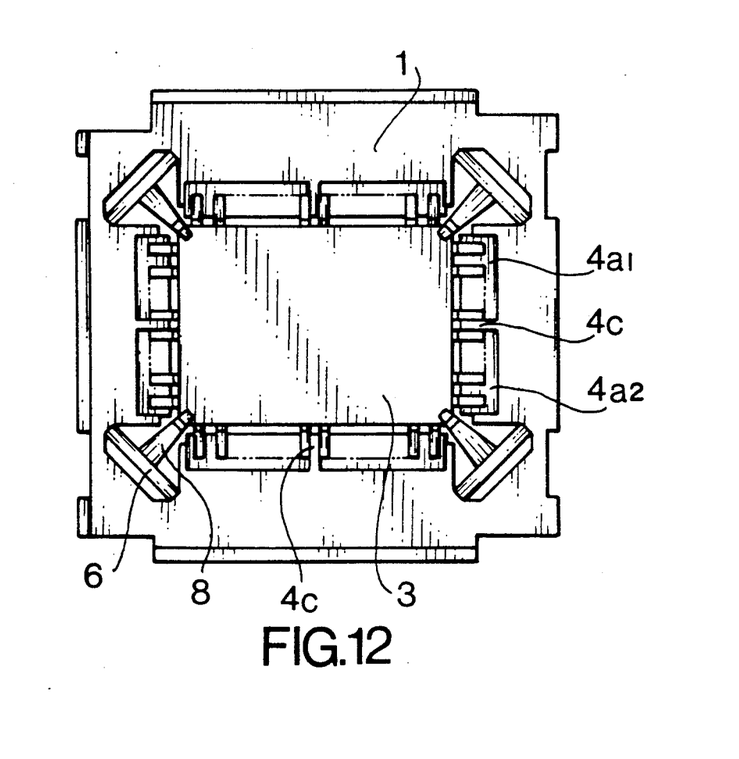
FIG. 12 is likewise a plan view of the IC carrier but with an IC package inserted therein.
Figure 13:
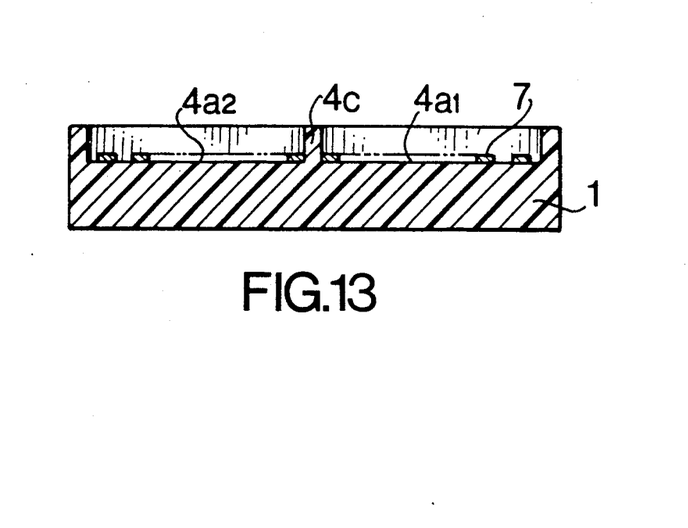
FIG. 13 is a sectional view taken through a lead wire supporting seat of the IC carrier.
Figure 14:
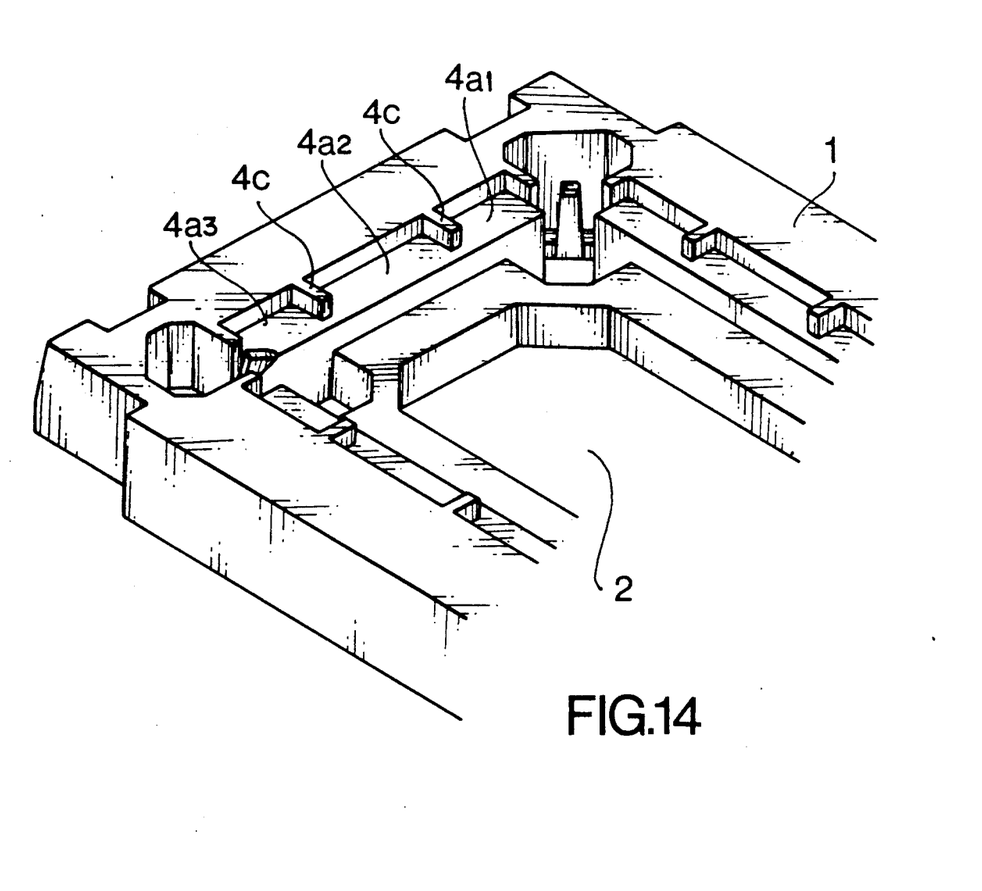
FIG. 14 is a perspective view of an important portion of an IC carrier having a lead wire supporting seat partitioned by two partition walls.

The partition wall 4c may be provided over the entire width of the lead wire supporting seat as shown in FIG. 10, or it may extend over only a portion of the entire width of the supporting seat 4 as shown in FIG. 14.

In the embodiment of FIG. 14, in order to divide the lead wire group 7 into three groups or more, two or more partition walls 4c are formed and three or more partitioned lead wire supporting seats $4a_1$, $4a_2$, $4_3$ are formed.

As described in the foregoing, the partition wall 4c is interposed between the lead wires at the central portion of each lead wire group 7 of the IC package 3, the IC package 3 is correctly positioned in the IC carrier 1 by the side surfaces of the IC lead wires between which the partition wall 4c is interposed, and the lead wire groups 7 are dividedly supported on the respective partitioned lead wire supporting seats $4a_1$, $4a_2$ and $4a_3$.

Each corner portion 4a of the carrier body 1 is provided with a torsion bar 5 having an axis extending diagonally across the corner portion 1a. A latch arm 6 is resiliently displaceable about the generally diagonal axis of the torsion bar 5. The latch arm 6 is provided on its free end with an engaging claw 6a adapted to engage an upper edge of the corner portion of the generally rectangular IC package 3 accommodated in the IC accommodating section 2. The engaging claw 6a is disposed on a longitudinal axis of the latch arm 6. The latch arm 6 provided on the torsion bar 5 and the engaging claw 6a form a lock means for holding the IC package 3 in a manner in which the IC package 3 can be inserted into and removed from the IC accommodating section 2.

In this way, the IC package 3 with its lead wires is supported on the lead wire supporting seat 4 as a package in the carrier 1.

As described in the foregoing, according to the present invention, the individual lead wires projecting sideward from the IC package are not separately accommodated in slots as in the prior art. Instead, they are supported on the lead wire supporting flat and slotless surface of the lead wire supporting seat.

Therefore, the problems associated with the conventional slot type IC carrier of the lead wires being deformed by the partition walls of the slots due to incorrect eye measurement as to the positional alignment of the lead wires and the slots, resulting in otherwise good products being made into inferior products, are overcome.

Also, since the IC package can be mounted without paying much attention to aligning the individual lead wires with the individual slots provided in the prior art, the mounting operation of the IC package in the IC carrier can be performed very easily and rapidly.

Furthermore, since the lead wire supporting flat surface of the lead wire supporting seat may be designed simply to accommodate for the width of a respective lead wire group, the pitch of the individual lead wires and the widths of the lead wires are not restricted.

Therefore, as long as the IC carrier can accommodate the lead wire groups, it can support various IC packages of different individual lead wire pitches and different lead wire widths. That is, one kind of IC carrier can support many different IC packages of which only the pitch and the widths of individual lead wires are different. The present invention overcomes the shortcomings of the conventional IC carriers which can receive only lead wires having the same pitch and the same width and lack an interchangeability capability and thus, the slotless type IC carrier according to the present invention is very economical.

A slotless type IC carrier of the present invention allows the recent requirements for very minute and very thin IC lead wires to be realized.

That is, the present invention obviates the problems in a slot forming technique required to be performed in association with very minute pitches of lead wires. In addition, the possible deformation of the lead wires and inefficient inserting operation of an IC package is overcome.

What is claimed is:

1. An IC carrier for holding an integrated circuit having an IC package body and groups of lead wires respectively projecting from sides of the IC package body, said IC carrier comprising:

means for holding an integrated circuit, having an IC package body including a bottom and sides and groups of lead wires respectively projecting from the sides of the IC package body, in a state in which the lead wires are supported by said IC carrier and the IC package body is clamped to said IC carrier with the bottom of the IC package body out of contact with said IC carrier, said means for holding comprising a generally rectangular thin one-piece substrate having a top, a bottom, a central opening extending in a direction therethrough from said top to said bottom, an IC accommodating section extending around said central opening, and lock means for clamping the IC package body of the integrated circuit to said substrate, said IC accommodating section comprising a stepped portion of said substrate defined by at least one flat supporting surface lying in a plane disposed perpendicular to the direction in which the central opening extends through said substrate, a rear wall extending upright from said flat supporting surface at a radially outermost side thereof with respect to said central opening, and a respective angular portion defining an edge at which each said at least one flat supporting surface terminates at a radially innermost side thereof with respect to said central opening, each respective said flat supporting surface being the only means of direct support provided in said IC carrier for a group of the lead wires of the integrated circuit to be held by said IC carrier, said rear wall substantially adjacent and confronting free ends of the group of lead wires of the integrated circuit to be held by said IC carrier so as to protect the lead wires from being damaged when the integrated circuit is held by said IC carrier, said angular portion for positioning the integrated circuit to be held by said IC carrier, and said flat supporting surface consisting of electrically non-conductive material, said lock means comprising a plurality of projections integral with and extending from said substrate, said projections being resiliently displaceable relative to said substrate.

2. The IC carrier as claimed in claim 1, wherein said at least one flat surface includes a plurality of flat surfaces extending at one side of said thin one-piece substrate, and said IC accommodating section further comprises a respective partition wall extending perpendicularly to and upright between each of said flat surfaces.

3. The combination carrier as claimed in claim 1, wherein only one said flat supporting surface extends at any one side of said thin one-piece substrate, and said IC accommodating section includes width establishing portions at which the one flat supporting surface terminates, said width establishing portions extending upright at ends of said one flat supporting surface, respectively, and projecting radially inwardly from said rear wall.

4. The combination of an IC carrier and an integrated circuit held by said IC carrier, said integrated circuit having an IC package body including a bottom and sides and groups of lead wires respectively projecting from the sides of said IC package body, each of said lead wires having a free end, and said IC carrier comprising a generally rectangular thin one-piece substrate having a top, a bottom, a central opening extending in a direction therethrough from said top to said bottom, an IC accommodating section extending around said central opening, said IC accommodating section comprising a stepped portion of said substrate defined by at least one flat supporting surface lying in a plane disposed perpendicular to the direction in which the central opening extends through said substrate, a rear wall extending upright from said flat supporting surface at a radially outermost side thereof with respect to said central opening, and a respective angular portion defining an edge at which each said at least one flat supporting surface terminates at a radially innermost side thereof with respect to said central opening, each of the groups of said lead wires being directly supported only by one said flat supporting surface in said IC carrier, said IC package body being disposed in said central opening with the bottom thereof being out of contact with said IC carrier, said rear wall confronting and substantially adjacent free ends of the group of lead wires of said integrated circuit so as to protect the lead wires from being damaged, said angular portion positioning said integrated circuit in the IC accommodating section of said IC carrier, and each said flat supporting surface which directly supports said lead wires consisting of electrically non-conductive material, and lock means clamping said integrated circuit to said substrate with the lead wires of the integrated circuit supported on said supporting surface, said lock means comprising a plurality of projections integral with and extending from said substrate, said projections being resiliently displaceable relative to said substrate.

5. The combination as claimed in claim 4, wherein said at least one flat surface includes a plurality of flat surfaces extending at one side of said thin one-piece substrate, and said IC accommodating section further comprises a respective partition wall extending upright and between each of said plurality of flat surfaces.

6. The IC carrier as claimed in claim 4, wherein only one said flat supporting surface extends at any one side of said thin one-piece substrate, and said IC accommodating section includes width establishing portions at which the one flat supporting surface terminates, said width establishing portions extending upright at ends of said one flat supporting surface, respectively, and projecting radially inwardly from said rear wall.

7. The combination as claimed in claim 4, wherein each of said lead wires includes a first portion protruding from said IC package body at a respective one of the sides thereof, a free end portion defining the free end of the lead wire, and an intermediate portion extending between and inclined relative to said first portion and said free end portion, and each of the group of said lead wires are directly supported only by a said flat supporting surface in said IC carrier with the free end portion of said each of the groups of lead wires resting on said one said flat supporting surface, with the edge at which said one said flat supporting surface terminates containing the lead wires at locations where the intermediate portions thereof extend from and are inclined relative to the free end portions thereof, respectively, and with the intermediate and first portions out of contact with said substrate.

* * * * *